US006953980B2

(12) United States Patent
Escoffier et al.

(10) Patent No.: US 6,953,980 B2
(45) Date of Patent: Oct. 11, 2005

(54) SEMICONDUCTOR FILTER CIRCUIT AND METHOD

(75) Inventors: Rene Escoffier, Mauzac (FR); Evgueniy Stefanov, Vieille Toulouse (FR); Jeffrey Pearse, Chandler, AZ (US); Francine Y. Robb, Tempe, AZ (US); Peter J. Zdebel, Austin, TX (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 260 days.

(21) Appl. No.: 10/166,288

(22) Filed: Jun. 11, 2002

(65) Prior Publication Data

US 2003/0228848 A1 Dec. 11, 2003

(51) Int. Cl.[7] .................... H01L 29/00

(52) U.S. Cl. .................... 257/499; 455/307; 455/339; 257/533

(58) Field of Search .................... 455/307, 339, 455/91, 115.1, 117, 127.1, 550.1; 257/301, 499, 532, 533; 533/181, 183–184, 186, 191–192, 204

(56) References Cited

U.S. PATENT DOCUMENTS

| | | | | | |
|---|---|---|---|---|---|
| 6,115,592 | A | * | 9/2000 | Ueda et al. | 455/307 |
| 6,121,669 | A | * | 9/2000 | Kalb et al. | 257/533 |
| 6,140,674 | A | * | 10/2000 | Hause et al. | 257/301 |

* cited by examiner

*Primary Examiner*—Simon Nguyen
(74) *Attorney, Agent, or Firm*—James J. Stipanuk; Robert F. Hightower

(57) ABSTRACT

A filter circuit (10) is formed on a semiconductor substrate (11) formed with a trench (40) that is lined with a dielectric layer (38). A conductive material (37) is disposed in the trench and coupled to a node (62) to provide a capacitance that modifies a frequency response of an input signal ($V_{IN}$) to produce a filtered signal ($V_{OUT}$). An electrostatic discharge device includes an inductor (74) coupled to back to back diodes (17, 18) formed in the substrate to avalanche when a voltage on the node reaches a predetermined magnitude.

19 Claims, 5 Drawing Sheets

SEMICONDUCTOR FILTER CIRCUIT AND METHOD

BACKGROUND OF THE INVENTION

The present invention relates in general to semiconductor devices and, more particularly, to low frequency filter networks formed on semiconductor substrates.

Wireless communications devices typically operate using both radio frequency (RF) signals and lower frequency audio signals. For example, cellular telephones transmit RF carrier signals that operate at frequencies of six gigahertz or more and are modulated with audio frequency voice information. A microphone generates an audio frequency signal from the voice information which is amplified and used to modulate the RF carrier signal. Most wireless communications devices use a low pass filter at the microphone input to suppress ambient RF carrier signals that may be "picked up" or detected by the microphone in order to avoid degrading the performance of the communications device by noisy operation, loop instability, or other effects that reduce the quality of the modulating audio signal. To accomplish this function, the low pass filters have a passband in the audio range, i.e., less than about twenty kilohertz.

Presently, these audio filters are formed with discrete passive components because of the difficulty of forming the large component values that set the filters' low frequency passband. However, the discrete filters add a substantial fabrication cost to a wireless device. Integrated filters based on semiconductor technology have a lower cost but have not been practical because of the large die area needed to integrate audio frequency components while providing an adequate voltage capability.

Hence, there is a need for an integrated filter that provides a high level of frequency selectivity while maintaining a low manufacturing cost.

DETAILED DESCRIPTION OF THE DRAWINGS

In the figures, elements having the same reference number have similar functionality.

Figure 1:
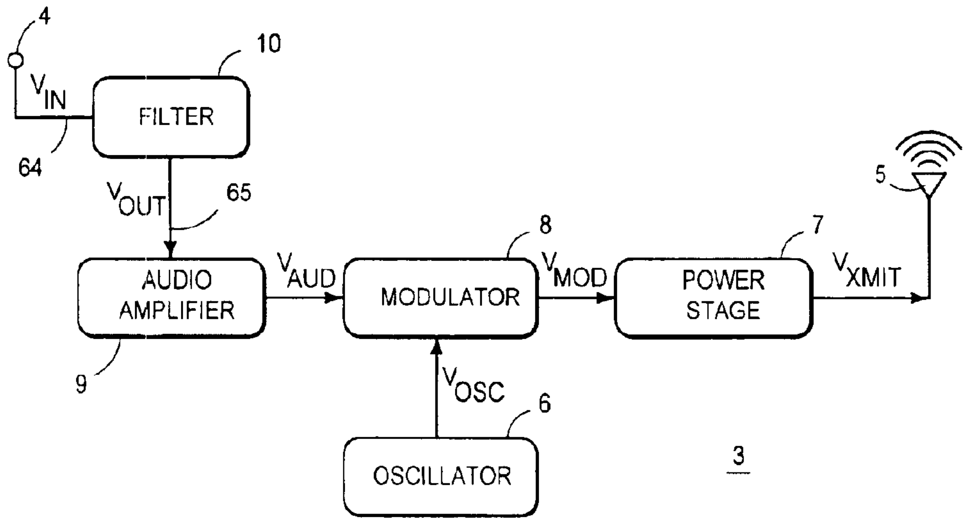
FIG. 1 is a block diagram of a wireless communications device.

FIG. 1 is a block diagram of a wireless communications device 3, including a microphone 4, an antenna 5, an oscillator 6, a power stage 7, a modulator 8, an audio amplifier 9 and a filter 10. Communications device 3 converts voice information received through microphone 4 to an electrical input signal $V_{IN}$ at a lead 64 of filter 10, and produces an RF transmitter signal $V_{XMIT}$ at a power level of two watts or more for transmitting by antenna 5. In one embodiment, communications device 3 is configured as a cellular telephone that broadcasts transmitter signal $V_{XMIT}$ to, for example, a cellular base station.

Filter 10 is a low pass microphone line filter used to suppress RF components of input signal $V_{IN}$ from other circuitry of communications device 3 such as audio amplifier 9. That is, filter 10 passes the audio frequency components of input signal $V_{IN}$ while rejecting or attenuating RF components. The audio components are generated by microphone 4 from voice information, while the RF components are produced by, for example, incident electromagnetic waves generated by antenna 5 at the $V_{XMIT}$ carrier frequency. In the case of a cellular telephone, where microphone 4 is in close proximity to antenna 5, the RF components, if not attenuated or suppressed, can have an amplitude sufficient to overload audio amplifier 9 or to cause signal distortion, noise, instability, or other undesirable effects on the performance of communications device 3. Filter 10 has an output at a lead 65 for producing a filtered audio output signal $V_{OUT}$. Filter 10 is specified to pass audio frequency components of $V_{IN}$ while attenuating RF component frequencies by a factor of at least thirty decibels at a frequency of six gigahertz. Hence, $V_{OUT}$ is substantially comprised of audio frequency components with few or no RF components.

Audio amplifier 9 amplifies output signal $V_{OUT}$ and produces an amplified audio signal $V_{AUD}$. Oscillator 6 generates an RF oscillator signal $V_{OSC}$ at the desired carrier frequency of transmitter signal $V_{XMIT}$. Modulator 8 modulates $V_{OSC}$ with $V_{AUD}$ and produces a modulated signal $V_{MOD}$ which is coupled to power stage 7 and amplified to produce transmitter signal $V_{XMIT}$. In one embodiment, $V_{XMIT}$ has an RF carrier frequency of about six gigahertz.

Figure 2:
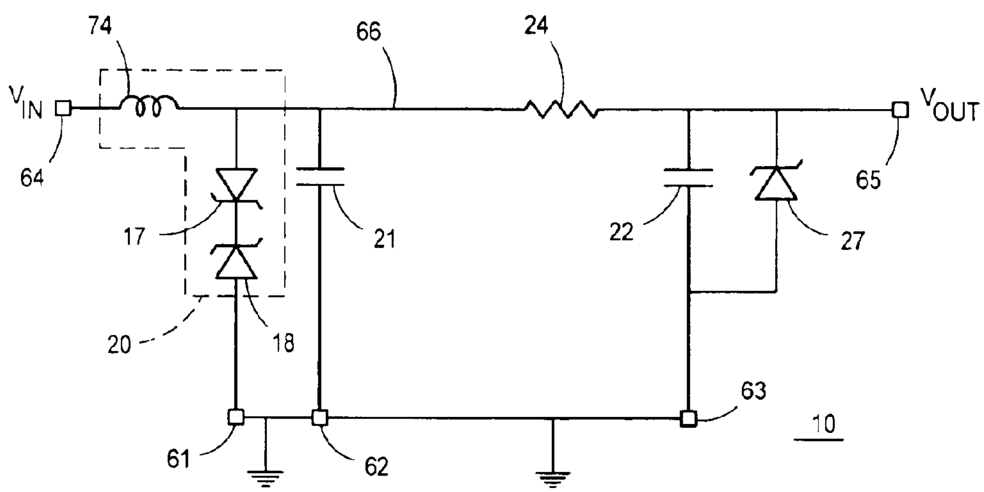
FIG. 2 is a schematic diagram of a filter circuit.

FIG. 2 is a schematic diagram of filter 10, including a resistor 24, capacitors 21–22, a clamp diode 27 and an electrostatic discharge (ESD) device 20 that includes back to back diodes 17–18 and an inductor 74. Input signal $V_{IN}$ has both audio frequency components and undesirable RF components. Output 65 produces filtered output signal $V_{OUT}$ operating at audio frequencies with RF components attenuated or suppressed. Filter 10 is configured for integrating on a semiconductor die to form an integrated circuit.

Figure 3:
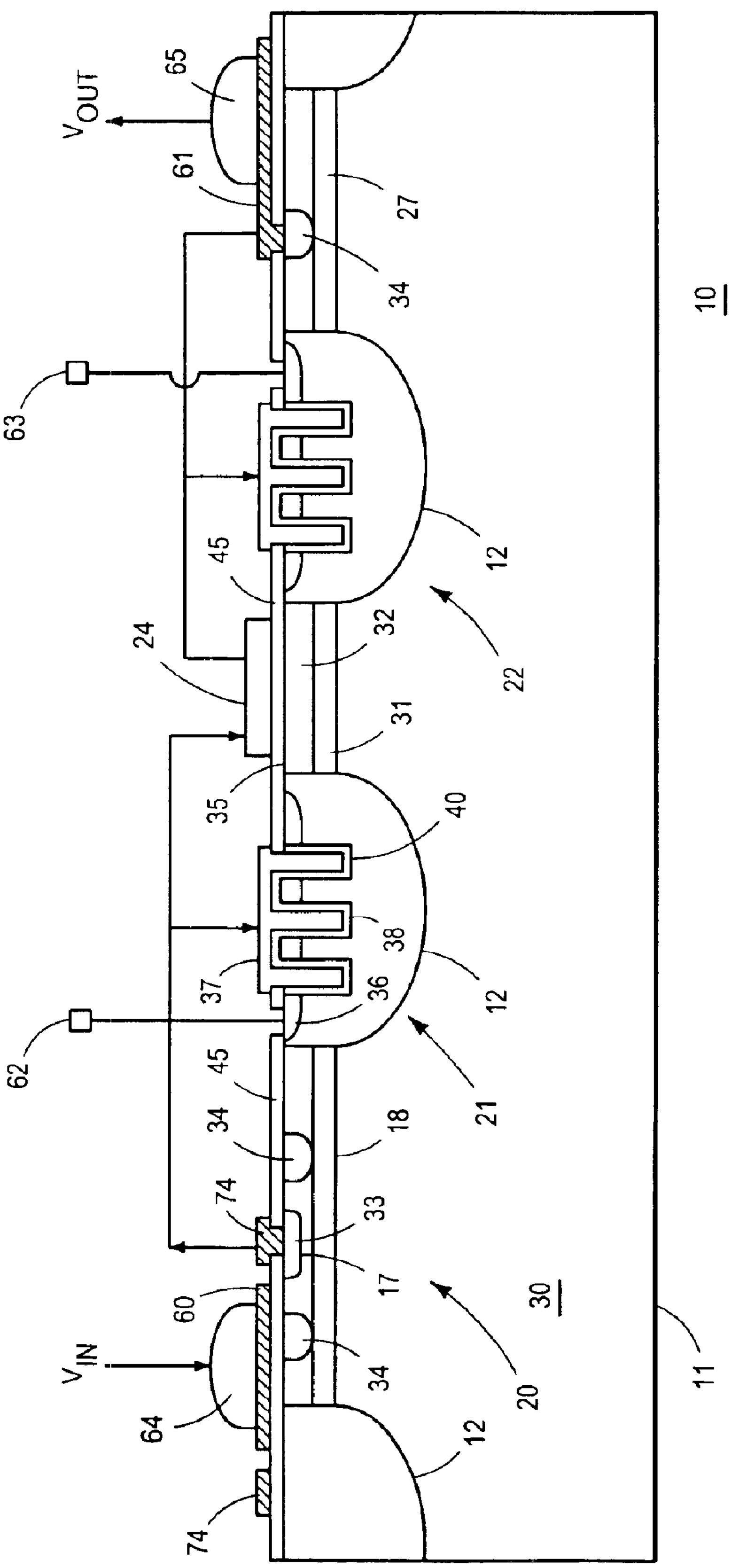
FIG. 3 is a cross-sectional view of the filter circuit integrated on a semiconductor substrate.

Diodes 17–18 of ESD device 20 comprise back to back zener or avalanche diodes formed as junctions in a semiconductor substrate as described below. Diodes 17–18 are referred to as back to back diodes because their common cathode (or, alternatively, common anode) arrangement results in one of them being reverse biased regardless of the polarity of $V_{IN}$. ESD device 20 dissipates electrostatic energy in the form of high voltage peaks of short duration which could damage sensitive system components. In one embodiment, ESD device 20 is formed to comply with International Electrotechnical Commission standard IEC61000-4-2 level four. In the embodiment of FIG. 3, diodes 17–18 have their respective cathodes commonly connected as shown to break down symmetrically when the voltage amplitude at node 66 reaches about fourteen volts positive and/or fourteen volts negative. During a positive voltage peak, diode 17 forward biases and diode 18 avalanches at about 13.3 volts, and during a negative voltage peak, diode 18 forward biases and diode 17 avalanches at about 13.3 volts. Alternatively, ESD device 20 may include back to back diodes formed with their anodes commonly connected, rather than their cathodes, to achieve a similar protective function.

Inductor 74 is formed as a planar spiral inductor to have a typical value in a range between 1–5 nanohenries. In one embodiment, inductor 74 is formed by patterning a standard metal interconnect layer.

Capacitors 21–22 are formed as trench capacitors connected as shown to respectively produce capacitances $C_{21}$=

$C_{22}$=1.0 nanofarads, approximately, that modify the frequency response of $V_{IN}$ to produce filtered output signal $V_{OUT}$. The trench design provides capacitors 21–22 with a low equivalent series resistance, and therefore a high quality factor, which results in a low impedance and high quality filtering function at RF frequencies.

Resistor 24 typically is formed as a thin film resistor with a low parasitic substrate capacitance for enhanced filter performance. Resistor 24 cooperates with capacitors 21–22 to establish a characteristic frequency response for filter 10. In one embodiment, resistor 24 is formed with doped polysilicon having a concentration selected to produce the specified resistance value in a small die area while providing a high level of control to maintain the resistances within a specified tolerance. In one embodiment, the value of resistor 24 is controlled to within plus or minus ten percent. In one embodiment, resistor 24 has a resistance of about fifty ohms and a temperature coefficient of resistance approaching zero.

Clamp diode 27 is an avalanche diode that breaks down to limit the voltage swing at lead 65 to avoid overloading the input stage of amplifier 9. Accordingly, clamp diode 27 also provides an ESD protection function at lead 65. In one embodiment, clamp diode 27 is formed with a structure similar to that of either diode 17 or diode 18, and therefore has similar characteristics, i.e., a breakdown voltage of about 13.3 volts.

FIG. 3 shows a cross-sectional view of filter 10 formed on a semiconductor substrate 11 and configured as an integrated filter circuit, showing inductor 74, resistor 24, ESD device 20, clamp diode 27 and capacitors 21–22.

A base layer 30 is formed with semiconductor material and heavily doped to function as a low resistance ground plane for filter 10. In one embodiment, base layer 30 has a doping concentration in a range between $10^{16}$ and $10^{21}$ atoms/centimeter$^3$. For example, base layer 30 may comprise monocrystalline silicon doped to provide a p-type conductivity and a doping concentration of about $2*10^{20}$ atoms/centimeter$^3$. The low resistivity of base layer 30 provides an effective ground plane that attenuates parasitic signals that would otherwise propagate through base layer 30 along parasitic signal paths to produce crosstalk and degrade filter performance.

An epitaxial layer 31 is grown over base layer 30 and doped to have an n-type conductivity. Epitaxial layer 31 forms a junction with base layer 30 to comprise diode 18, so the doping concentration of epitaxial layer 31 is selected to provide a specified avalanche voltage for diode 18 such as, for example, 13.3 volts. Epitaxial layer 31 typically has a thickness in a range between two and ten micrometers. In one embodiment, epitaxial layer 31 is grown to a thickness of about 2.5 micrometers and a concentration of about $5*10^{17}$ atoms/centimeter$^3$.

A layer 32 is formed over epitaxial layer 31 to have an n-type conductivity. A doped region 33 is formed by introducing p-type dopants from a surface 35 of substrate 11 to produce a junction that functions as diode 17. The doping concentrations of epitaxial layer 32 and doped region 33 are selected to provide a specified avalanche voltage for diode 17 such as, for example, 13.3 volts. In one embodiment, layer 32 is an epitaxial layer grown to a thickness of about three micrometers and a concentration of about $1\times10^{17}$ atoms/centimeter$^3$, and doped region 33 has a thickness of about one micrometer and a surface concentration of about $6.0*10^{19}$ atoms/centimeter$^3$. Alternatively, epitaxial layer 31 is grown to a thickness of about 5.5 micrometers and layer 32 is formed by subjecting epitaxial layer 31 to a blanket p-type diffusion to reduce its effective concentration to set the breakdown voltage of diode 17 to the desired level. This diffusion step reduces the doping concentration of epitaxial layer 31 within a depth less than about three micrometers.

An isolation region or sinker 12 is formed as a ring around ESD device 20 with a p-type conductivity and a depth of about twenty micrometers to electrically isolate ESD device 20 from other components. Sinker 12 is diffused through epitaxial layers 31–32 to provide an external electrical contact to base layer 30 at surface 35, which is facilitated by adding a doped region 36 using the processing steps used to form doped region 33. Hence, doped region 36 has a p-type conductivity to electrically couple sinker 12 through doped region 36 to an interconnect trace connected to lead 62.

A channel stopper 34 is heavily doped to have an n-type conductivity and a depth of about three micrometers. Channel stopper 34 surrounds doped region 33 and prevents surface 35 from inverting to form a channel that would result in a conduction path from doped region 33 to base layer 20. In addition, channel stopper 34 increases ESD robustness of the device by ensuring the dissipation of lateral current flow injected during ESD event to avoid current filaments forming at surface 35.

A dielectric material is disposed on surface 35 and patterned and etched to produce dielectric regions 45. In one embodiment, dielectric regions 45 comprise silicon dioxide thermally grown to a thickness of about five hundred angstroms followed by a layer about one micrometer thick of deposited silicon dioxide.

Capacitor 21 is formed as a trench capacitor by etching semiconductor substrate 11 to a depth of about seven micrometers to form a plurality of trenches 40 within sinker 12 as shown. In an alternative embodiment, trench 40 comprises several rows of individual trenches or a single serpentine trench that extends along surface 35 and intersects the view plane multiple times as needed to produce $C_{21}$=1.0 nanofarads of capacitance.

A dielectric material is formed to line inner surfaces of trench 40 to form a dielectric liner 38. In one embodiment, the dielectric material includes silicon nitride formed to a thickness of about four hundred angstroms.

A conductive material such as doped polysilicon is deposited and etched to form a conductive region 37 that fills trench 40 to function as a first electrode of capacitor 21 with sinker 12 functioning as a second electrode. Sinker 12 is coupled to lead 62 through shallow, heavily doped p-type contact region 36 that is formed with the processing steps used to form doped region 33. Capacitor 22 is formed in a similar fashion.

Clamp diode 27 is formed by the junction of base layer 30 and epitaxial layer 31 and isolated from other components by surrounding it with sinker 12 as shown. Hence, clamp diode 27 has a breakdown characteristic similar to that of diode 18 in ESD device 20.

A standard integrated circuit metal layer is deposited and etched to form bonding pads 60 and 61, along with interconnect traces. Inductor 74 is concurrently formed by patterning this standard integrated circuit metal layer. Other interconnect traces are represented schematically to simplify the figure.

Node 64 comprises a bonding structure shown as a metallic bump such as a solder bump or copper bump used for mounting filter 10 in a flip-chip fashion to a system circuit board (not shown). Alternatively, the bonding structure may comprise a wire bond or other suitable structure for providing external electrical and/or mechanical connections.

The bonding structure has a parasitic inductance $L_{64}$ of between about 0.05 and 0.1 nanohenries which produces an impedance or inductive reactance $X_{64}=2*\Pi*f_c*L_{64}$ to input signal $V_{IN}$, where $f_c$ is the RF carrier frequency of transmitter signal $V_{XMIT}$. For example, if $L_{64}$=0.1 nanohenries and $f_c$=6.0 gigahertz, $X_{64}=2*\Pi*(6.0*10^9)*(0.1*10^{-9})$ has a value of about four ohms.

Output signal $V_{OUT}$ is provided at node 65 through a structure similar to that of node 64. The node 65 bonding structure has a parasitic inductance $L_{65}$ whose value is similar to the value of $L_{64}$.

Figure 3A:
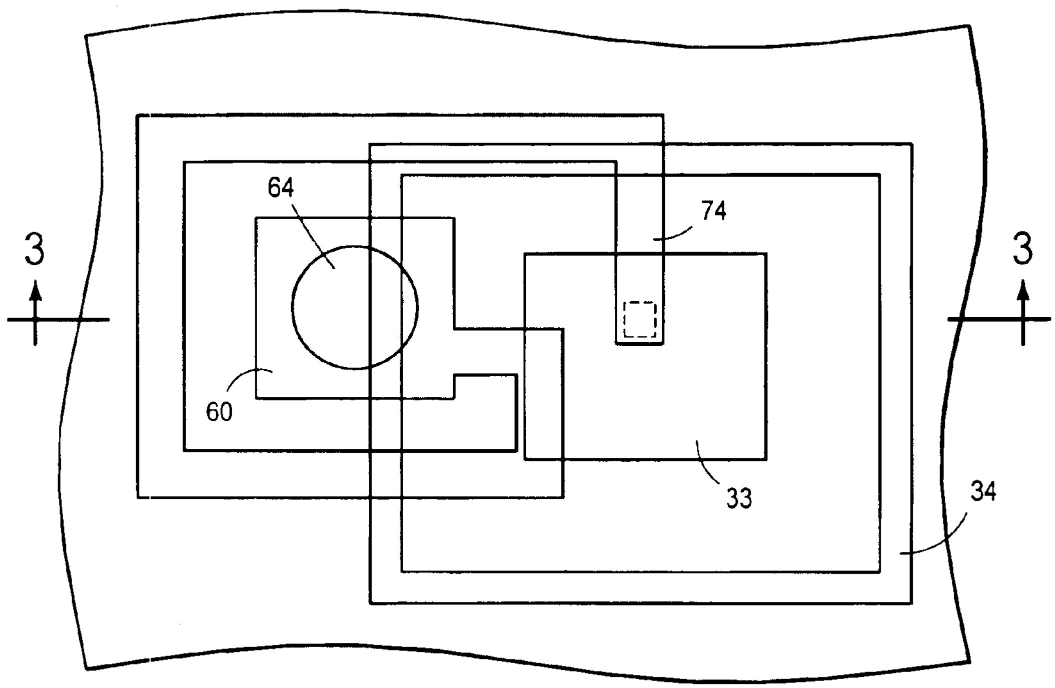
FIG. 3A is a top view of the drawing of the filter circuit of FIG. 3 showing an inductor.

FIG. 3A is a top view of a portion of filter 10 showing inductor 74 formed around bonding pad 60. In the embodiment of FIG. 3A, inductor 74 is formed as a single winding that circumscribes the perimeter of bonding pad 60 and is spaced about twenty micrometers away. Alternatively, inductor 74 may be formed as a planar spiral inductor having multiple windings. Inductor 74 typically has an inductance in a range between one and five nanohenries. Inductor 74 provides a smoothing function that flattens or integrates the voltage peaks of an ESD event, thereby improving the robustness of filter 10. In addition, inductor 74 improves signal filtering by compensating for high frequency signal feedthrough due to parasitic inductances $L_{64}$ and $L_{65}$ described above.

Figure 4:
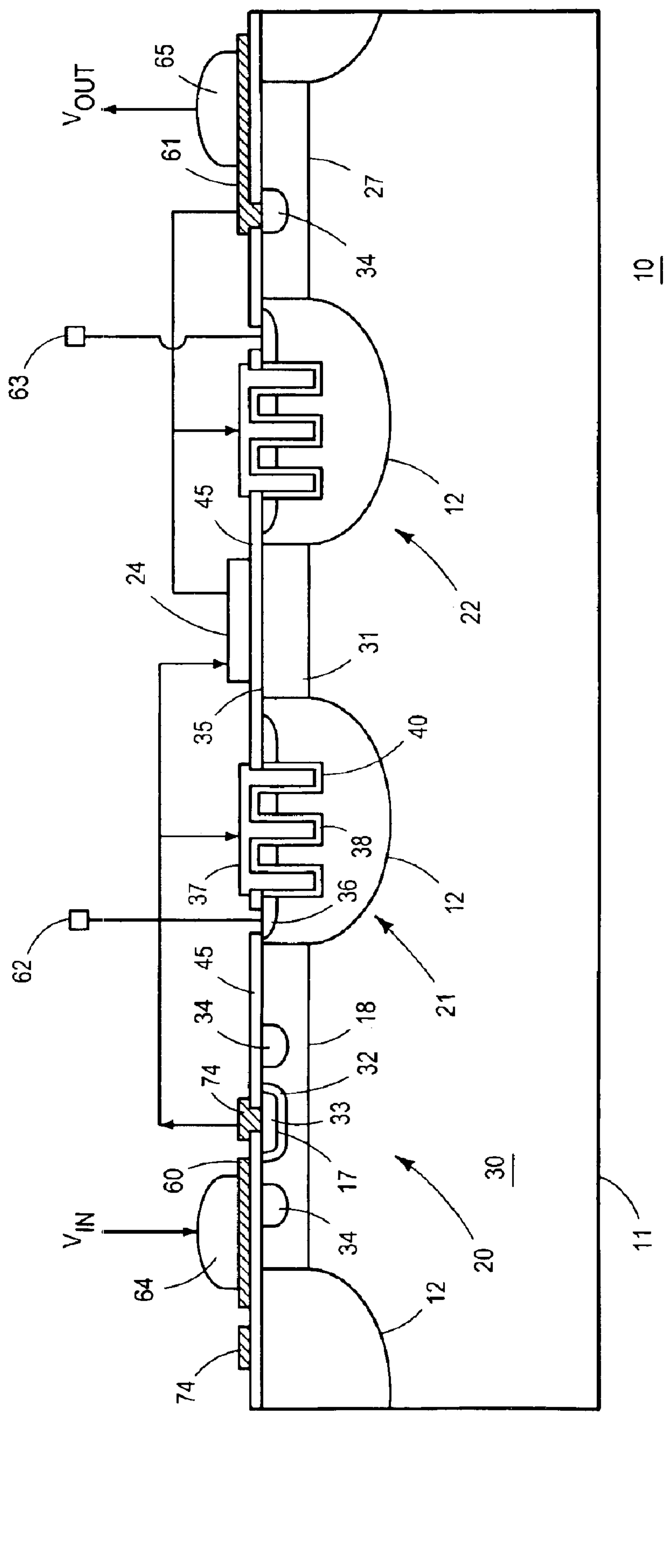
FIG. 4 is a cross-sectional view of the filter circuit in an alternative embodiment.

FIG. 4 is a cross-sectional view of filter 10 in an alternate embodiment. The previously described features have similar structures and operation, except that epitaxial layer 31 is grown to a thickness of about 5.5 micrometers. Layer 32 is formed as a masked region of p-type conductivity that surrounds doped region 33. In this embodiment, region 32 has the same conductivity type but is more lightly doped than doped region 33, which has the effect of shifting the portion of diode 17 which breaks down to the bottom surface of layer 32 rather than side surfaces. This adjustment ensures that diode 17 has a large effective breakdown area and low impedance to dissipate the energy generated by an ESD event, thereby providing a high degree of reliability.

Figure 5:
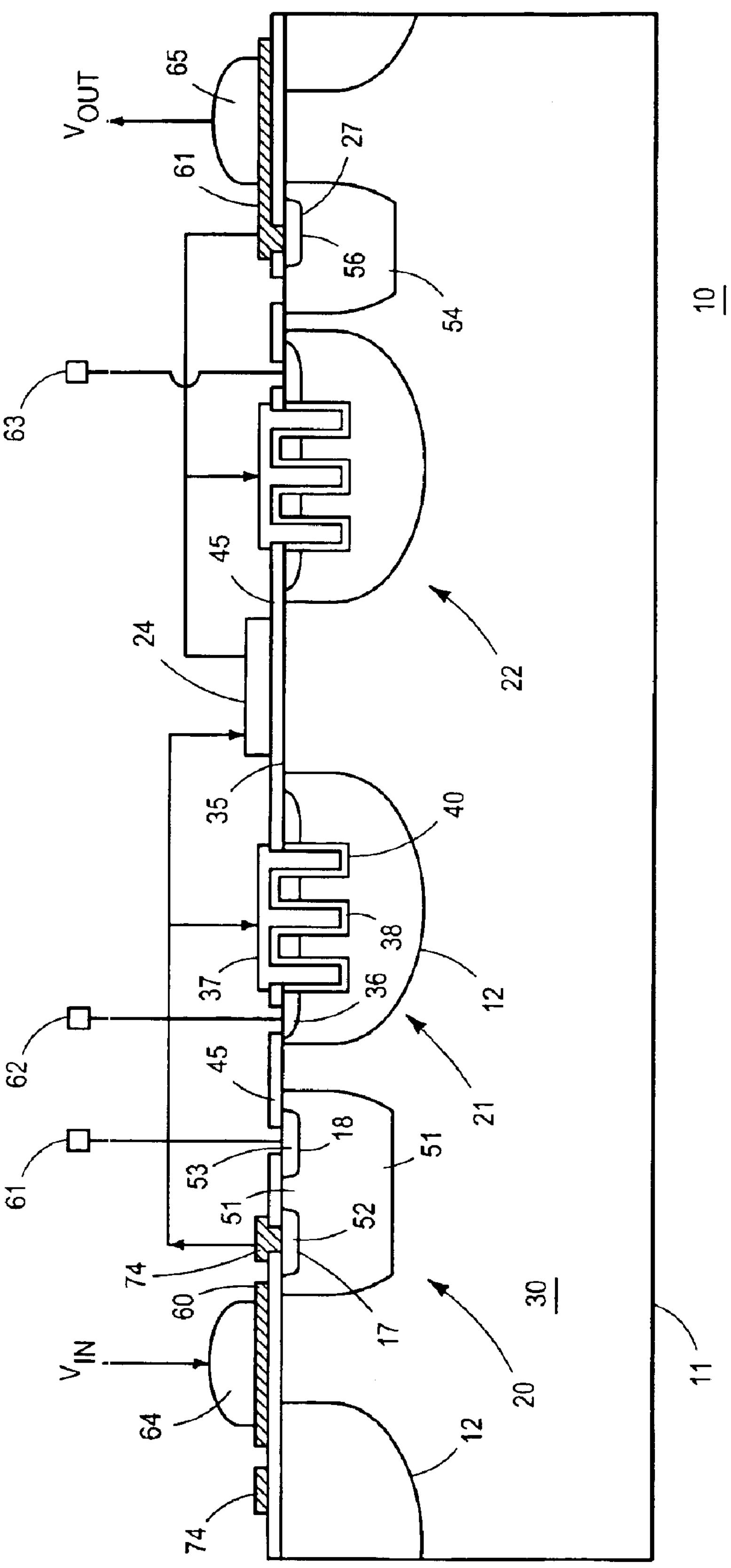
FIG. 5 is a cross-sectional view of the filter circuit in another alternate embodiment.

FIG. 5 is a cross sectional view of filter 10 in another alternate embodiment in which base layer 30 is formed as a high resistivity material. In this embodiment, base layer 30 comprises lightly doped n-type monocrystalline silicon with an effective carrier concentration of $3*10^{12}$ atoms/centimeter$^3$ and a resistivity of about one thousand ohm-centimeters. Such a high resistivity improves the electrical isolation between adjacent components which reduces signal coupling through parasitic signal paths and improves filter performance.

P-type dopants are implanted through surface 35 and diffused into semiconductor substrate 11 to form well regions 51 and 54. In one embodiment, well regions 51 and 54 are formed to a depth of about fifteen micrometers. Well regions 51 and 54 typically are doped to a lower concentration than sinkers 12 but the same thermal cycle is used to diffuse well regions 51 and 54 and sinkers 12 into substrate 11. The lower concentration of well regions 51 and 54 results in their being shallower than sinkers 12.

N-type dopants are introduced into substrate 11 through openings in dielectric region 45 to form doped regions 52–53 within well region 51 and a doped region 56 within well region 54. Doped regions 52–53 form junctions with well region 51 that operate as back to back diodes 17–18, respectively, of ESD device 20. The doping concentrations of well region 51 and doped regions 52–53 are adjusted to provide a predefined breakdown voltage to meet the specified performance of ESD device 20. In one embodiment, doped regions 52–53 are each formed with a rectangular shape to occupy an area of surface 35 which is about two hundred micrometers on a side. Note that because doped regions 52 and 53 are formed with the same processing steps the avalanche breakdown voltages and other performance parameters are symmetrical with respect to the polarity of the voltage on node 64.

Similarly, doped region 56 and well region 54 form a junction that comprises clamp diode 27.

In summary, the present invention provides an integrated filter circuit that achieves a specified frequency selectivity while utilizing integrated circuit technology to achieve a small physical size and a low manufacturing cost. A semiconductor substrate is formed with a trench that is lined with a dielectric layer. A conductive material is used to fill the trench to provide a capacitance that filters an input signal. Back to back diodes are formed in the substrate to avalanche when an electrostatic discharge voltage reaches a predetermined magnitude.

What is claimed is:

1. An integrated filter for filtering an input signal, comprising:

- a semiconductor substrate formed with a trench that is lined with a dielectric layer;
- a first conductive material disposed in the trench and coupled to a node to provide a capacitance that modifies a frequency response of the input signal to produce a filtered signal;
- a protection circuit that includes back to back diodes formed in the semiconductor substrate to avalanche when a voltage on the node reaches a predetermined magnitude; and
- an inductor formed oven in the semiconductor substrate with the inductor coupled between the node and an input that is configured to receive an input signal to the integrated filter.

2. The integrated filter of claim 1, wherein the inductor is formed as a planar device on a surface of the semiconductor substrate.

3. The integrated filter of claim 1, wherein the semiconductor substrate includes a base layer of a first conductivity type and a doping concentration in a range between $10^{18}$ and $10^{21}$ atoms per cubic centimeter.

4. The integrated filter of claim 3, wherein the back to back diodes include:

- a first doped region of a second conductivity type that forms a first junction with the base layer; and
- a second doped region having the first conductivity type for forming a second junction with the first doped region, wherein the second doped region is coupled to the node.

5. The integrated filter of claim 4, wherein the first doped region comprises an epitaxial layer grown on the base layer.

6. The integrated filter of claim 5, wherein the second doped region is diffused from a surface of the epitaxial layer.

7. The integrated filter of claim 6, wherein the second doped region includes:

- a first portion having a first surface concentration and diffused to a first depth; and
- a second portion having a second surface concentration less than the first surface concentration and diffused to a second depth greater than the first depth.

8. The integrated filter of claim 5, wherein the epitaxial layer includes:

- a first portion formed over the base layer and having a first doping concentration; and a second portion formed over the first portion and having a second doping concentration less than the first doping concentration.

9. The integrated filter of claim 5, wherein the epitaxial layer has a thickness between two and ten micrometers and a doping concentration in a range between $10^{16}$ and $10^{18}$ atoms per cubic centimeter.

10. The integrated filter of claim 5, wherein impurities of the first conductivity type are diffused through a surface of the epitaxial layer to reduce a doping concentration of the epitaxial layer within a depth less than three micrometers.

11. The integrated filter of claim 1, wherein the semiconductor substrate includes a base layer having a doping concentration in a range between $10^{12}$ and $10^{14}$ atoms per cubic centimeter.

12. The integrated filter of claim 1, wherein the trench is formed in a first well region of the semiconductor substrate.

13. The integrated filter of claim 12, wherein the back to back diodes are formed in a second well region of the semiconductor substrate, the second well region and the semiconductor substrate having the opposite conductivity type.

14. The integrated filter of claim 13, wherein the back to back diodes further comprise:

a first doped region formed within the second well region to provide a first junction of the back to back diodes; and a second doped region formed within the second well region to provide a second junction of the back to back diodes.

15. The integrated filter of claim 1, wherein the first conductive material comprises doped polysilicon.

16. The integrated filter of claim 1, wherein the capacitance is produced by a trench capacitor, further comprising a thin film resistor coupled to the trench capacitor.

17. The integrated filter of claim 1 wherein the dielectric material is formed within the trench.

18. A wireless communications device, comprising:

a power stage that receives a modulated signal and transmits an output signal of the wireless communications device;

a modulator that modulates a radio frequency carrier signal with an audio signal to produce the modulated signal;

a microphone for converting voice information to the audio signal, where the microphone receives a portion of the output signal; and a filter formed on a semiconductor substrate and interposed between the microphone and the power stage for attenuating radio frequency components of the output signal, including a first doped region formed on a surface of the semiconductor substrate;

a second doped region formed on the surface of the semiconductor substrate, the second doped region having a conductivity opposite to a conductivity of the semiconductor substrate;

a trench formed within the first doped region, the trench having sidewalls;

a dielectric material positioned at least on a portion of the sidewalls of the trench to line the trench;

a first conductive material disposed on the dielectric material within the trench to provide a capacitance that attenuates the radio frequency components; and an electrostatic discharge circuit including back to back diodes formed in the second doped region to limit an amplitude of a terminal voltage of the filter to a predetermined value.

19. An integrated filter for filtering an input signal, comprising:

a semiconductor substrate;

a first doped region formed in the semiconductor substrate;

a second doped region formed in the semiconductor substrate;

a trench formed in the first doped region wherein the trench is lined with a dielectric layer;

a first conductive material disposed in the trench and coupled to a node to provide a capacitance that modifies a frequency response of the input signal to produce a filtered signal; and a protection circuit that includes back to back diodes formed in the Second doped region to avalanche when a voltage on the node reaches a predetermined magnitude.

* * * * *